(12) United States Patent
Fischer et al.

(10) Patent No.: US 9,128,140 B2
(45) Date of Patent: Sep. 8, 2015

(54) DETECTION OF A FAULT IN AN UNGROUNDED ELECTRIC POWER DISTRIBUTION SYSTEM

(71) Applicant: Schweitzer Engineering Laboratories, Inc., Pullman, WA (US)

(72) Inventors: Normann Fischer, Colfax, WA (US); Amandeep Singh Kalra, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 14/477,495

(22) Filed: Sep. 4, 2014

(65) Prior Publication Data

US 2015/0077133 A1    Mar. 19, 2015

Related U.S. Application Data

(60) Provisional application No. 61/878,361, filed on Sep. 16, 2013.

(51) Int. Cl.
*G01R 31/14* (2006.01)
*G01R 31/02* (2006.01)
*G01R 31/08* (2006.01)
*H02H 3/16* (2006.01)

(52) U.S. Cl.
CPC .............. *G01R 31/08* (2013.01); *G01R 31/085* (2013.01); *G01R 31/086* (2013.01); *G01R 31/088* (2013.01); *H02H 3/165* (2013.01)

(58) Field of Classification Search
USPC ............ 324/509, 510, 511, 522, 537; 361/42; 702/58
See application file for complete search history.

(56) References Cited

U.S. PATENT DOCUMENTS

| | | |
|---|---|---|
| 4,387,336 A | 6/1983 | Joy |
| 4,829,298 A | 5/1989 | Fernandes |
| 4,996,624 A | 2/1991 | Schweitzer |
| 5,006,846 A | 4/1991 | Granville |
| 5,224,011 A | 6/1993 | Yalla |
| 5,315,527 A | 5/1994 | Beckwith |

(Continued)

OTHER PUBLICATIONS

Casper Labuschagne, Izak Van Der Merwe, A Comparison Between High-Impedance and Low-Impedance Restricted Earth Fault Transformer Protection, Nov. 7, 2007.

(Continued)

*Primary Examiner* — Amy He
(74) *Attorney, Agent, or Firm* — Jared L. Cherry; Richard M. Edge

(57) ABSTRACT

Detection of a fault in an ungrounded electric power distribution system that includes a plurality of feeders and buses is disclosed herein. Embodiments consistent with the present disclosure may monitor an electrical parameter associated with each of a plurality of feeders and buses in the ungrounded electric power distribution system. An incremental change in the monitored electrical parameters may be determined using the monitored electrical parameter. Further, the incremental change may be associated with a first sub-set of the plurality of feeders. Torque values for the feeders may be calculated using a reference quantity from the bus first exhibiting an incremental change above a threshold. A feeder having the largest incremental change in the first sub-set of the plurality of feeders may be identified. A fault may be identified based on the torque and the incremental change.

20 Claims, 9 Drawing Sheets

(56) References Cited

U.S. PATENT DOCUMENTS

| | | | |
|---|---|---|---|
| 5,341,265 A | 8/1994 | Westrom | |
| 5,422,561 A | 6/1995 | Williams | |
| 5,428,549 A | 6/1995 | Chen | |
| 5,446,387 A | 8/1995 | Eriksson | |
| 5,446,682 A | 8/1995 | Janke | |
| 5,498,954 A | 3/1996 | Bassett | |
| 5,498,956 A | 3/1996 | Kinney | |
| 5,515,227 A | 5/1996 | Roberts | |
| 5,530,338 A | 6/1996 | Beckwith | |
| 5,541,498 A | 7/1996 | Beckwith | |
| 5,544,064 A | 8/1996 | Beckwith | |
| 5,550,459 A | 8/1996 | Laplace | |
| 5,550,460 A | 8/1996 | Bellin | |
| 5,581,173 A | 12/1996 | Yalla | |
| 5,592,393 A | 1/1997 | Yalla | |
| 5,646,512 A | 7/1997 | Beckwith | |
| 5,680,324 A | 10/1997 | Schweitzer, III | |
| 5,694,281 A | 12/1997 | Roberts | |
| 5,699,219 A | 12/1997 | Arita | |
| 5,703,745 A | 12/1997 | Roberts | |
| 5,731,943 A | 3/1998 | Roberts | |
| 5,793,750 A | 8/1998 | Schweitzer, III | |
| 5,821,716 A | 10/1998 | Okanik | |
| 5,963,404 A | 10/1999 | Guzman-Casillas | |
| 6,028,754 A | 2/2000 | Guzman-Casillas | |
| 6,236,949 B1 | 5/2001 | Hart | |
| 6,249,230 B1 * | 6/2001 | Baldwin et al. | 340/650 |
| 6,265,881 B1 | 7/2001 | Meliopoulos | |
| 6,313,614 B1 | 11/2001 | Persson | |
| 6,341,055 B1 | 1/2002 | Guzman-Casillas | |
| 6,356,421 B1 | 3/2002 | Guzman-Casillas | |
| 6,411,865 B1 | 6/2002 | Qin | |
| 6,442,010 B1 | 8/2002 | Kasztenny | |
| 6,446,682 B1 | 9/2002 | Viken | |
| 6,518,767 B1 | 2/2003 | Roberts | |
| 6,573,726 B1 | 6/2003 | Roberts | |
| 6,603,298 B2 | 8/2003 | Guzman-Casillas | |
| 6,608,742 B2 | 8/2003 | Schweitzer | |
| 6,662,124 B2 | 12/2003 | Schweitzer | |
| 6,721,671 B2 | 4/2004 | Roberts | |
| 6,757,146 B2 | 6/2004 | Benmouyal | |
| 6,760,670 B2 | 7/2004 | Stoupis | |
| 6,785,105 B2 | 8/2004 | Roberts | |
| 6,839,210 B2 | 1/2005 | Roberts | |
| 6,845,333 B2 | 1/2005 | Anderson | |
| 6,934,654 B2 | 8/2005 | Benmouyal | |
| 6,946,753 B2 | 9/2005 | Kernahan | |
| 7,027,896 B2 | 4/2006 | Thompson | |
| 7,196,884 B2 | 3/2007 | Guzman-Casillas | |
| 7,271,572 B2 | 9/2007 | Labuschagne | |
| 7,319,576 B2 | 1/2008 | Thompson | |
| 7,323,852 B2 | 1/2008 | Hoffman | |
| 7,345,488 B2 | 3/2008 | Fischer | |
| 7,355,369 B2 | 4/2008 | Lavieville et al. | |
| 7,425,778 B2 | 9/2008 | Labuschagne et al. | |
| 7,463,467 B2 | 12/2008 | Lee et al. | |
| 7,480,580 B2 | 1/2009 | Zweigle et al. | |
| 7,504,806 B2 | 3/2009 | Labuschagne | |
| 7,570,469 B2 | 8/2009 | Guzman-Casillas | |
| 7,582,986 B2 | 9/2009 | Folkers | |
| 7,595,614 B2 | 9/2009 | Stich | |
| 7,630,863 B2 | 12/2009 | Zweigle | |
| 7,642,736 B2 | 1/2010 | Genkawa | |
| 7,660,088 B2 | 2/2010 | Benmouyal | |
| 7,710,693 B2 | 5/2010 | Guzman | |
| 8,321,162 B2 | 11/2012 | Labuschagne | |
| 2004/0021995 A1 | 2/2004 | Roberts | |
| 2004/0027748 A1 | 2/2004 | Kojovic | |
| 2004/0059469 A1 | 3/2004 | Hart | |
| 2005/0280965 A1 | 12/2005 | Lee | |
| 2006/0193099 A1 | 8/2006 | Schweitzer | |
| 2006/0224336 A1 | 10/2006 | Petras | |
| 2007/0085549 A1 | 4/2007 | Fischer | |
| 2007/0086134 A1 | 4/2007 | Zweigle | |
| 2007/0090811 A1 | 4/2007 | Labuschagne | |
| 2008/0071482 A1 | 3/2008 | Zweigle | |
| 2008/0088466 A1 | 4/2008 | Labuschagne | |
| 2008/0281540 A1 | 11/2008 | Zweigle | |
| 2009/0085407 A1 | 4/2009 | Venkatasubramanian | |
| 2009/0088989 A1 | 4/2009 | Guzman-Casillas | |
| 2009/0088990 A1 | 4/2009 | Schweitzer | |
| 2009/0089608 A1 | 4/2009 | Guzman-Casillas | |
| 2009/0091867 A1 | 4/2009 | Guzman-Casillas | |
| 2009/0099798 A1 | 4/2009 | Gong | |
| 2009/0125158 A1 | 5/2009 | Schweitzer | |
| 2009/0134854 A1 | 5/2009 | Labuschagne | |
| 2009/0231769 A1 | 9/2009 | Fischer | |
| 2010/0002348 A1 | 1/2010 | Donolo | |
| 2010/0114390 A1 | 5/2010 | Stevenson | |
| 2011/0068803 A1 | 3/2011 | Calero | |
| 2012/0068717 A1 | 3/2012 | Gong | |
| 2012/0323397 A1 | 12/2012 | Schweitzer, III | |
| 2013/0088239 A1 | 4/2013 | Mynam | |
| 2014/0236503 A1 * | 8/2014 | Sun | 702/59 |

OTHER PUBLICATIONS

Ali Kazemi, Casper Labuschagne, Protecting Power Transformers from Common Adverse Conditions, Sep. 16, 2005.

Armando Guzman, Satish Samineni, Mike Bryson, Protective Relay Synchrophasor Measurements During Fault Conditions, Sep. 20, 2005.

Ken Behrendt, Normann Fischer, Casper Labuschagne, Considerations for Using Harmonic Blocking and Harmonic Restraint Techniques on Transformer Differential Relays, Oct. 19, 2006.

Joe Mooney, Satish Samineni, Distance Relay Response to Transformer Energization: Problems and Solutions, Jan. 31, 2007.

Armando Guzman, Normann Fischer, Casper Labuschagne, Improvements in Transformer Protection and Control, Jan. 29, 2009.

PCT/US2010/059734 Patent Cooperation Treaty, International Search Report and Written Opinion of the International Searching Authority, Feb. 9, 2011.

Terry L. Conrad, Concurrent Technologies Corporation, Distributed State Estimator at U.S. Virgin Islands Water and Power Authority St. Thomas and St. John, NASPI Working Group Meeting, Mar. 7, 2008.

A.P. Sakis Meliopoulos, George J. Cokkinides, Floyd Galvan, Bruce Fardanesh, Georgia Institute of Technology, Entergy Services, Inc and New York Power Authority, Distributed State Estimator-Advances and Demonstration, Jan. 2008.

Pserc—Ali Abur andMladen Kezunovic, Texas A&M University, Sakis Meliopoulos, Georgia Institute of Technology, Enhanced State Estimation by Advanced Substation Monitoring, Power Systems Engineering Research Center, Nov. 2002.

Saman A. Zonouz and William H. Sanders, Information Trust Institute, Coordinated Science Laboratory, and Electrical and Computer Engineering Department University of Illinois at Urbana-Champaign, A Kalman-based Coordination for Hierarchical State Estimation: Algorithm and Analysis, Jan. 2008.

ABB: Improved Power System Performance through Wide Area Monitoring, Protection, and Control, 2004.

ABB, Wide Area Measurement, Monitoring, Protection and Control Industrial IT for Energy System Operation—(2003).

Sasa Jakovljevic, Mladen Kezunovic, Software for Enhanced Monitoring in Integrated Substations, 2003 IEEE Bologna Power Tech Conference, Jun. 23-26, 2003.

Y. Wu, M. Kezunovic, Automatic Simulation of IED Measurements for Substation Data Integration Studies, Power Engineering Society General Meeting, Jun. 12-16, 2005.

Sasa Jakovljevic, Data Collecting and Processing for Substation Integration Enhancement, May 2003.

M. Kezunovic, G. Latisko, Automated Monitoring Functions for Improved Power System Operation and Control, Power Engineering Society General Meeting, Jun. 12-16, 2005.

Bill Fleming, Negative-Sequence Impedance Directional Element, 1998.

Fernando Calero, Rebirth of Negative-Sequence Quantities in Protective Relaying with Microprocessor-Based Relays , Sep. 18, 2003.

PCT/US2014/054233 Patent Cooperation Treaty, International Search Report and Written Opinion of the International Searching Authority, Jan. 2, 2015.

* cited by examiner

DETECTION OF A FAULT IN AN UNGROUNDED ELECTRIC POWER DISTRIBUTION SYSTEM

RELATED APPLICATIONS

This application claims benefit under 35 U.S.C. §119(e) of U.S. Provisional Application No. 61/878,361, filed 16 Sep. 2013, naming Normann Fischer and Amandeep Kalra as inventors, and titled "Detection of a Fault in an Ungrounded Electric Power Distribution System" which is hereby incorporated by reference herein in its entirety.

TECHNICAL FIELD

This disclosure relates to detecting a fault in an ungrounded electric power delivery system. More particularly, but not exclusively, this disclosure relates to techniques for detecting a faulted feeder in a system including of a plurality of feeders supplied from multiple sources in an ungrounded electric power system. Further, the systems and methods disclosed herein may be used to detect faults on a busbar in an ungrounded electric power system.

BRIEF DESCRIPTION OF THE DRAWINGS

Non-limiting and non-exhaustive embodiments of the disclosure are described, including various embodiments of the disclosure, with reference to the figures, in which.

DETAILED DESCRIPTION

Figure 1:
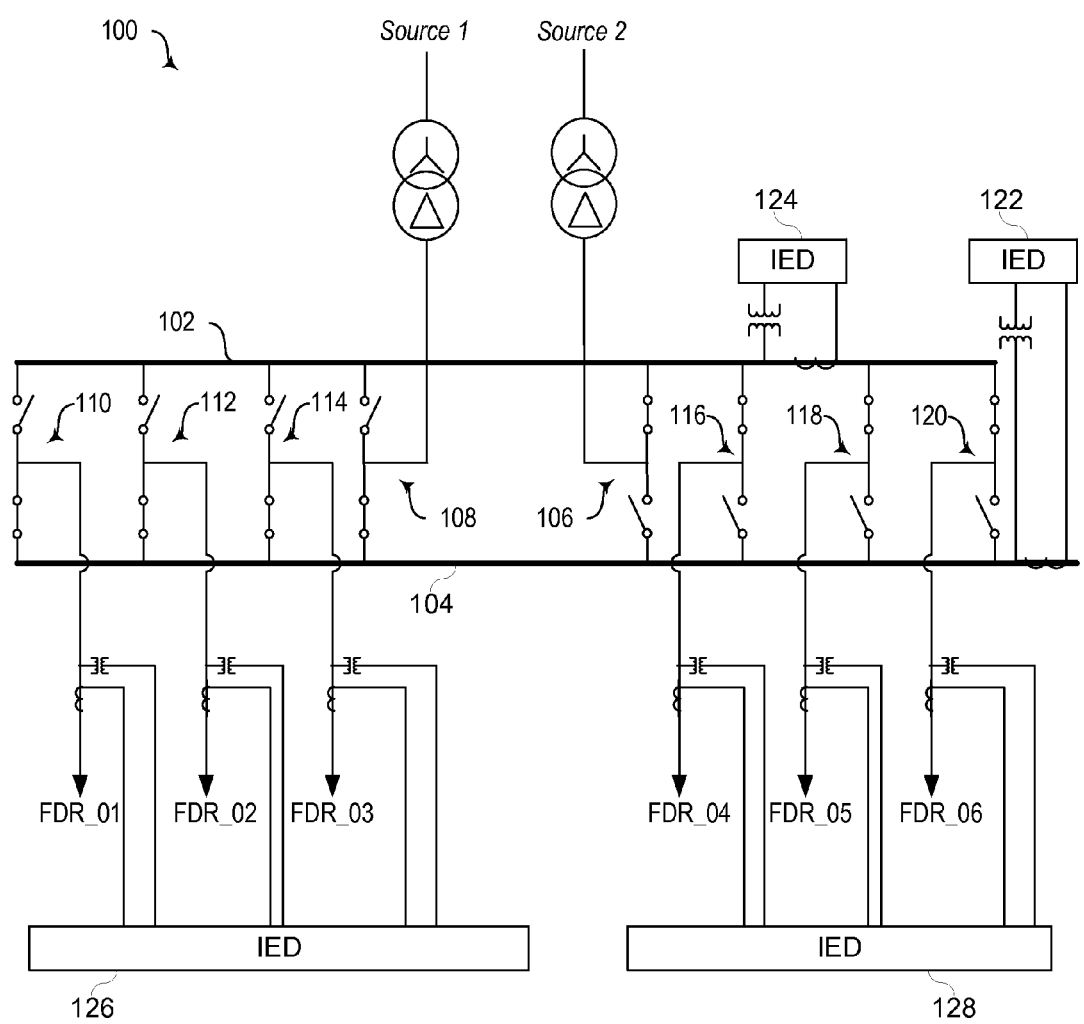
FIG. 1 illustrates a one-line diagram of a system including two sources and a plurality of feeders that may be selectively coupled to either of the two sources consistent with embodiments of the present disclosure.

In an ungrounded electric power distribution system, feeders (e.g., overhead power lines and/or underground cables) may be switched from one busbar fed by one power source to another busbar fed by another power source without an associated protective device or electrically utility personnel knowing to which busbar a particular feeder is connected. When a fault occurs on one of the feeders, the protective device may not be capable of identifying which busbar it should utilize to obtain a polarizing voltage (3V0), which may also be referred to as a residual voltage.

Various embodiments consistent with the present disclosure may associate the busbar with the highest incremental change in its residual voltage (3V0) with each feeder experiencing an incremental change in its residual current (3I0). Accordingly, only the feeders that are connected to the same busbar as a faulted feeder will be polarized with the residual voltage from the busbar associated with the faulted feeder. In this way, even if there is a large standing residual current or voltage on the system, only the feeders that experienced an incremental change in their residual current will be included in a faulted zone. The voltage used to polarize the feeders in the faulted zone will be the voltage that experienced the greatest incremental change in its residual voltage.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described will be illustrated as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic and/or processor executable instructions.

FIG. 1 illustrates a one-line diagram of a system 100 including two sources (i.e., "source 1" and "source 2") and a plurality of feeders (i.e., "FDR_01"-"FDR_06") that may be selectively coupled to either of the two sources consistent with embodiments of the present disclosure. System 100 includes two busbars 102 and 104 that are selectively connectable to either source 1 or source 2 using switching assemblies 106, 108. Each of the six feeders, labeled FDR_01 through FDR_06, in system 100 are also selectively connectable to busbars 102 and 104 using switching assemblies 110-120. According to some embodiments, the switching assemblies 106-120 may be configured so that each source or feeder is connected to only one busbar 102 and 104 at a time. According to other embodiments, the switching assemblies 106-120 may be configured to allow a feeder or source to be connected to both busbars 102 and 104 at the same time.

Although not specifically illustrated, the sources, the busbars 102, 104, and the feeders may be monitored by one or more Intelligent Electronic Devices (IEDs) and/or other types of protective devices. As illustrated, IED 126 is in communication with feeders FDR_01, FDR_02, and FDR_03 to obtain signals therefrom using current transformers (CTs), and potential transformers (PTs). IED 128 is in communication with feeders FDR_04, FDR_05, and FDR_06 to obtain signals therefrom using CTs and PTs. Further, IED 124 is in communication with bus 102 to obtain signals therefrom using CTs and PTs. Finally, IED 122 is in communication with bus 104 to obtain signals therefrom using CTs and PTs. IEDs 122-128 may be in communication using a communications system such as that described in conjunction with FIG. 3.

In certain circumstances, feeders may be switched from one busbar (e.g., busbar 104) fed by one power source (e.g., source 1) to another busbar (e.g., busbar 102) fed by another power source (e.g., source 2) without an associated protective device being updated regarding the busbar to which the feeder is connected. When a fault occurs on one of the feeders, the protective device may therefore not have sufficient information to determine which of the feeders are potentially affected by the fault. As illustrated, IEDs 122-128 are not in communication with switches 110-120 and, therefore, may not be aware of the configuration of the switches 110-120.

Figure 2:
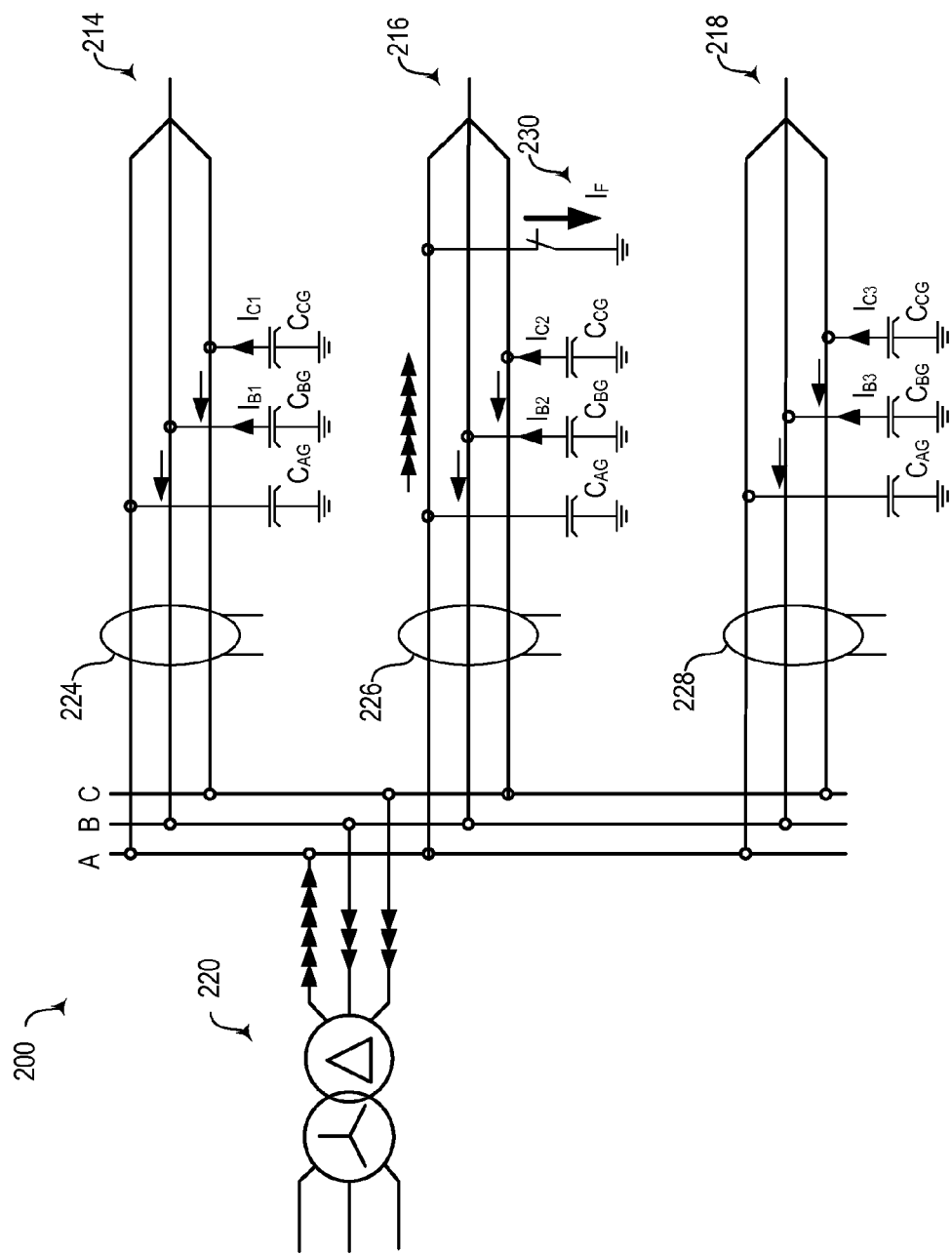
FIG. 2 illustrates a three-line diagram of a system including three feeders and that illustrates current flows in the system resulting from a fault on one phase of one of the feeders 214-218 consistent with embodiments of the present disclosure.

FIG. 2 illustrates a three-line diagram of a system 200 including three feeders 214-218 and that illustrates current flows in the system resulting from a fault 230 on one phase of one of the feeders 214-218 consistent with embodiments of the present disclosure. Sensors 224-228 may be configured to monitor each of the three feeders 214-218. According to some embodiments, sensors 224-228 may be connected to current transformers or potential transformers, which may in turn be connected to an input module configured to create digitized representation of current and/or voltage measurements. Each of the three feeders 214-218 is supplied electrical power by a delta-wye transformer 220.

As illustrated, a ground fault 230 is associated with phase A on feeder 216. A fault current, $I_F$, associated with ground fault 230 flows from phase A to ground as a result of the fault 230. Feeders that are electrically connected to the same source (i.e., feeders 214 and 218) as the faulted feeder (i.e., feeder 216) may experience an incremental change in current flow as a result of the fault current $I_F$. More specifically, as a result of the fault current $I_F$, other currents are induced in system 200, including currents $I_{B1}$, $I_{C1}$, $I_{B2}$, $I_{C2}$, $I_{B3}$, and $I_{C3}$. As illustrated, the flow of the current associated with the fault 230, $I_F$, is in the opposite direction of the flow of currents in the other feeders (i.e., feeders 214 and 218). As described in greater detail below, certain embodiments of the present disclosure may monitor the flow of currents in a system including a plurality of feeders 214-218 to determine which feeders 214-218 are affected by a fault 230.

Figure 3:
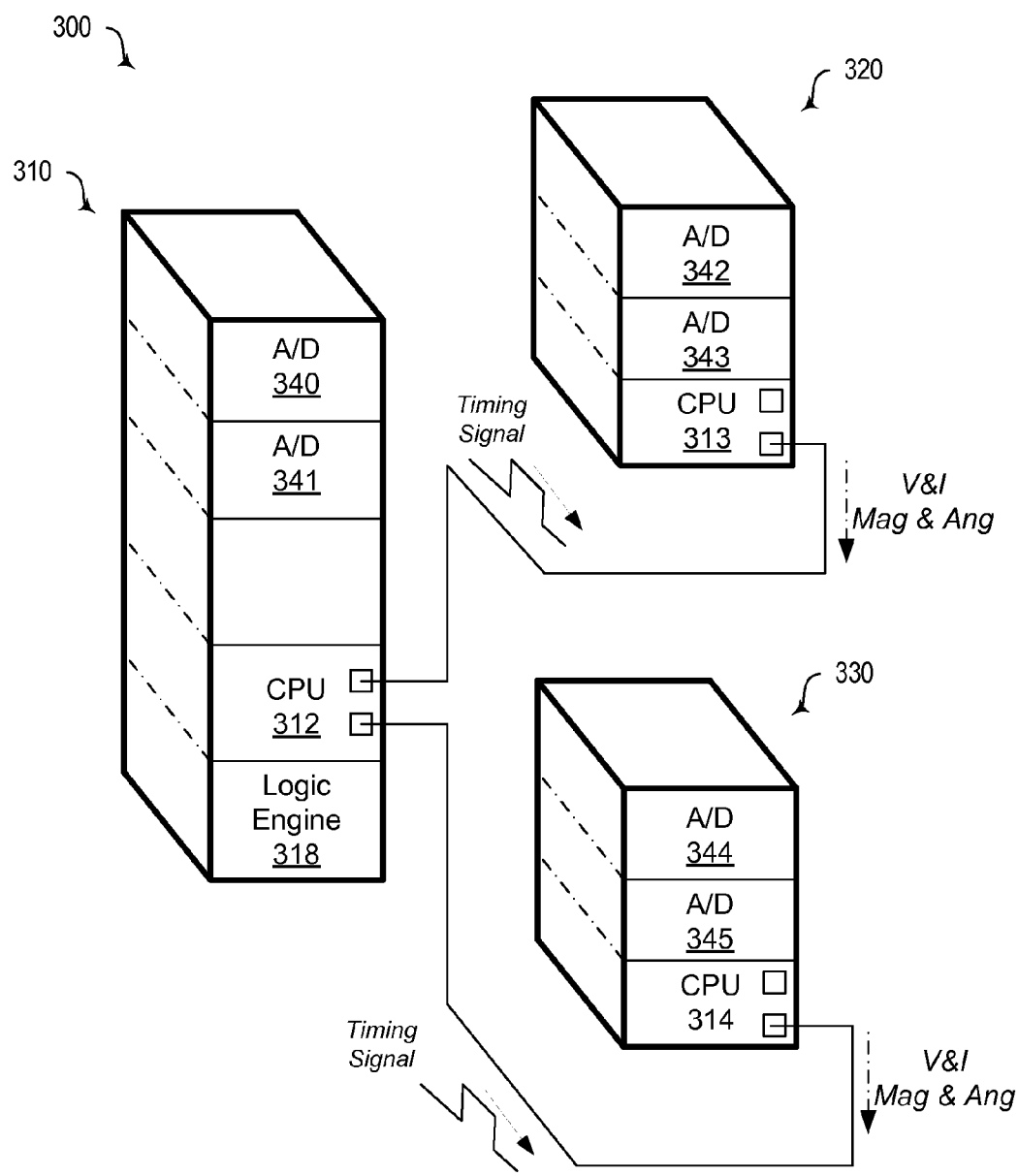
FIG. 3 illustrates a functional block diagram of a system 300 for monitoring an electrical power distribution system including a plurality of feeders (not shown) consistent with embodiments of the present disclosure.

FIG. 3 illustrates a functional block diagram of a system 300 for monitoring an electrical power distribution system including a plurality of feeders (not shown) consistent with embodiments of the present disclosure. System 300 includes a central controller 310 and two distributed controllers 320 and 330. Central controller 310 and/or distributed controllers 320 and 330 may be implemented, according to certain embodiments, using the Axion® Distributed Control and Integration Platform available from Schweitzer Engineering Laboratories of Pullman, Wash. (SEL).

Central controller 310 includes a CPU 312, which is configured, among other things, to generate a timing signal that is communicated to distributed controllers 320 and 330. The timing signal may be used to synchronize the operation of system 300 and/or to time-stamp data collected by central controller 310 and/or distributed controllers 320 and 330. Central controller 310 further includes a logic engine 318 that is configured to analyze data collected by central controller 310 and distributed controllers 320 and 330. According to some embodiments, data collected by distributed controllers 320 and 330 may be communicated to central controller 310 for processing and analysis. Alternatively, data may be processed, in whole or in part, using CPUs 313 and/or 314 included in distributed controls 320 and 330, respectively. Moreover, the task of analyzing and processing the data may be distributed among CPUs 312-314 and logic engine 318.

Data may be communicated among the central controller 310 and the distributed controllers 320 and 330 using a variety of data communication technologies, including, for example, EtherCAT®, Ethernet, SONET, SDH, or the like. Analysis of the data may be enabled and/or facilitated by use of the common timing signal. According to one embodiment, CPU 312 and/or logic engine 318 may be embodied using the SEL-2241 Real-Time Automation Controller available from SEL. Although the particular embodiment illustrated in FIG. 3 illustrates direct connections between central controller 310 and distributed controllers 320 and 330, alternative embodiments may utilize different topologies. For example, the devices may be connected in a ring topology or a daisy-chain topology.

System 300 includes a plurality of analog/digital (A/D) converters 340-345. A/D converters may be configured to obtain measurements associated with a plurality of feeders (not shown) in an electrical power delivery system. A/D converters 340-345 may obtain electric power system information using current transformers (CTs), potential transformers (PTs), Rogowski coils, and/or the like. The operation of A/D converters 340-345 may, according to some embodiments, be synchronized using the timing signal distributed by central controller 310. The data collected by A/D converters may include voltages, currents, phase angles, and other electrical characteristics. According to some embodiments A/D converters may be embodied as SEL-2244-2 Digital Input Modules available from SEL.

FIGS. 4-8 illustrate a variety of systems 400, 500, 600, 700, and 800 that may be used to perform certain functions described herein. In certain embodiments, systems 400, 500, 600, 700, and 800 may be communicatively coupled and operate in conjunction to perform certain functions described herein. Although the illustrated systems may be used together, the present disclosure is not limited to the specific implementations illustrated in FIGS. 4-8. Rather, certain embodiments may omit one or more elements illustrated in FIG. 4-8. Further, embodiments consistent with the present disclosure may utilize alternate designs and/or features.

Figure 4:
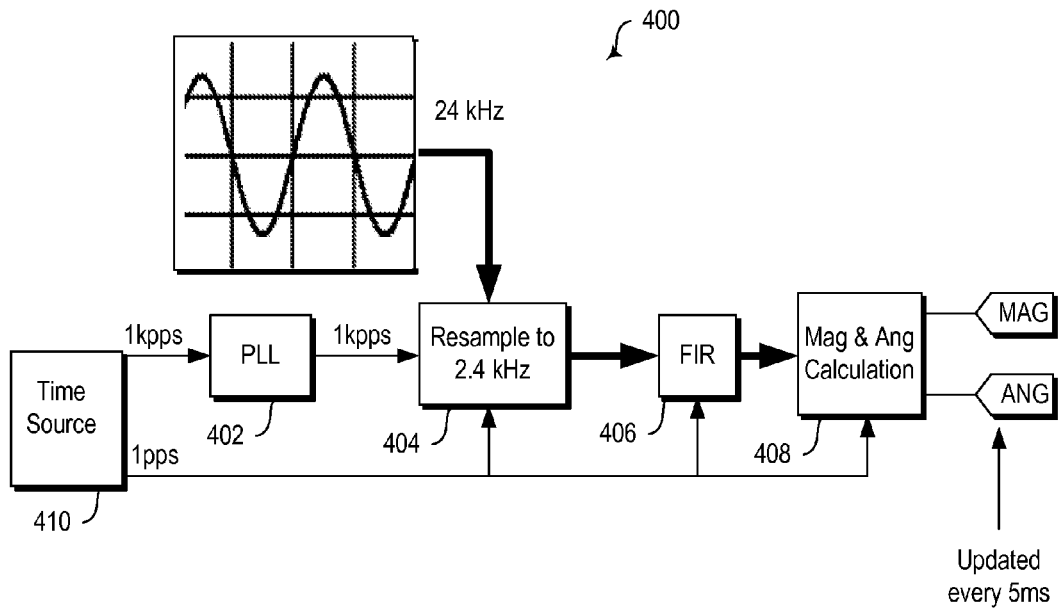
FIG. 4 illustrates a block diagram of a system that may be implemented to synchronize the operation of a plurality of A/D converters consistent with embodiment of the present disclosure.

FIG. 4 illustrates a block diagram of a system 400 that may be implemented to synchronize the operation of a plurality of A/D converters, such as A/D converters 340-345 illustrated in FIG. 3, consistent with embodiment of the present disclosure. A time source 410 may provide a 1 kpps and 1 pps signal which may be used to synchronize a phase lock loop (PLL) 402, which may generate a locked 1 kpps signal provided to a re-sampler 404, although it will be appreciated that other suitable frequencies may also be utilized. According to some embodiments, the time source 410 may comprise central controller providing a time signal, such as central controller 310 illustrated in FIG. 3. According to other embodiments, time source 410 may be embodied as a Global Navigational Satellite System (GNSS) such as the0 Global Positioning System (GPS) system delivering a time signal corresponding with IRIG, a WWVB or WWV system, a network-based system such as corresponding with IEEE 1588 precision time protocol, and/or the like. In one specific embodiment, time source 410 may comprise a satellite-synchronized clock (e.g., Model No. SEL-2407, available from SEL), although in other embodiments time source 410 may be any time source capable of delivering the 1 kpps and 1 pps time signal and/or any other suitable time signals to system 400. The re-sampler 404 may generate a 2.4 kHz re-sampler synchronized to the top of second (TOS) by the 1 pps signal. The re-sampler may then re-sample a 24 kHz non-synchronized data input to a 2.4 kHz synchronized data stream where the $1^{st}$ sample is taken at the TOS. The 24 kHz non-synchronized data input may be associated with a voltage or current sensor in electrical communication with an electric power distribution system. The re-sampled data may then be provided as an input to a finite impulse response (FIR) filter 406. According to some embodiments, FIR filter 406 may be embodied as a full cosine FIR filter where the processing of the data is also synchronized using the 1 pps signal. In such embodiments, the data may be re-sampled synchronously and/or processed synchronously. A variety of signal frequencies may be used in connection the operation with system 400, and that any suitable frequency or frequencies may be utilized in implementing certain embodiments of the systems and methods disclosed herein.

A magnitude and angle calculation system 408 may use the output of the FIR filter 406 to compute a magnitude and a phase angle at a set interval. According to some embodiments, a magnitude and phase angle may be calculated every 5 milliseconds, although other suitable calculation frequencies may also be utilized. The magnitude and angle calculation system 408 may associate the calculated values with an alias name and/or time stamp. According to some embodiments, an alias name may include an indication an associated feeder for the data value.

Figure 5:
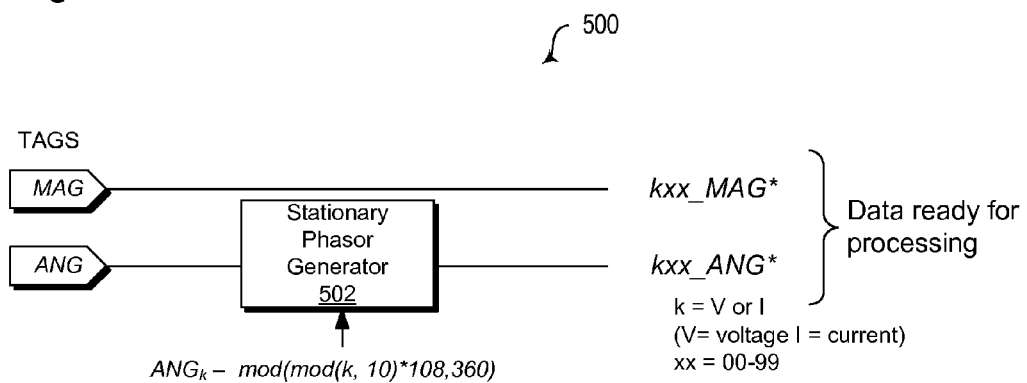
FIG. 5 illustrates a system that may be used to process an incoming data stream of magnitude and angle calculations tagged with information regarding the source of the data consistent with embodiments of the present disclosure.

FIG. 5 illustrates a system 500 that may be used to process an incoming data stream of magnitude and angle calculations tagged with information regarding the source of the data consistent with various embodiments of the present disclosure. According to some embodiments, the data stream received by system 500 may be provided by the system 400 illustrated in FIG. 4. System 500 may transform the incoming data stream from a rotating phasor to a stationary phasor. In other words, system 500 may convert the data stream from a "polar" format to a "rectangular" format in order to facilitate further analysis of the data. While some embodiments consistent with the present disclosure may perform this polar-to-rectangular-conversion, other embodiments may analyze the data in polar format. In such embodiments, system 500 may be modified or omitted.

According to the illustrated embodiment, and as described in connection with one embodiment of FIG. 4, data may be transmitted at a rate of 5 milliseconds. A data transmission rate may relate to angular increment of 108° degrees between successive samples. Accordingly, to create a stationary phasor, a stationary phasor generator 502 may subtract n*108 degrees from a measured angle, where n is a sample number associated with each data sample. The output of the system 500 may be passed to a subsequent system for further processing.

Figure 6:
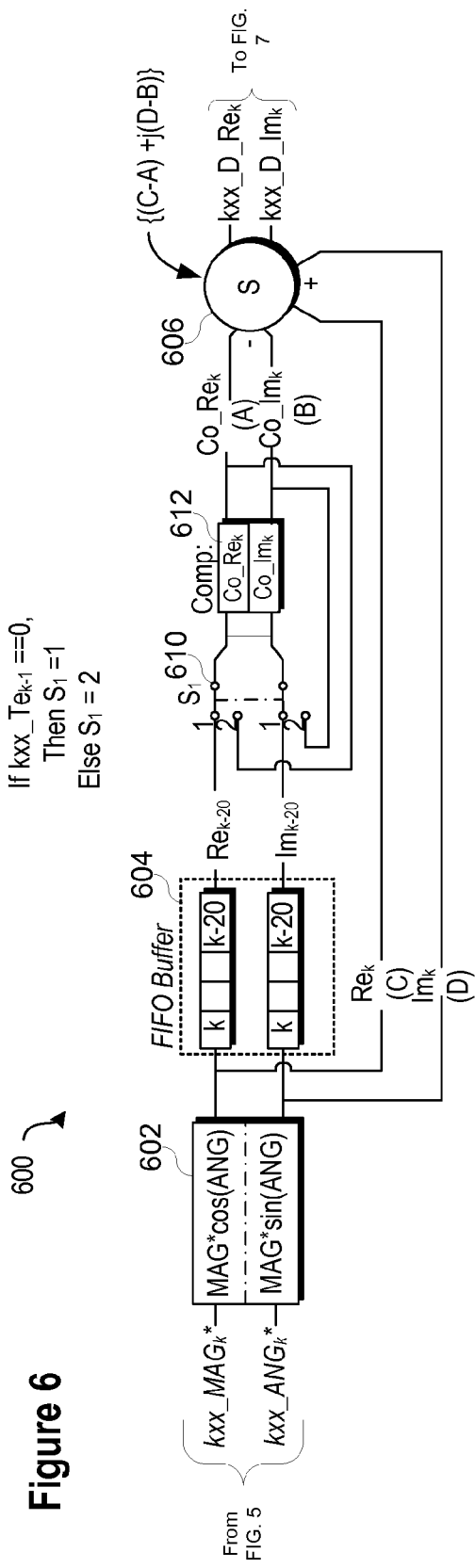
FIG. 6 illustrates a system that may determine whether a change in an incoming data stream has occurred in a specific time interval consistent with embodiments of the present disclosure.

FIG. 6 illustrates a system 600 that may determine whether a change in an incoming data stream has occurred in a specific time interval consistent with various embodiments of the present disclosure. According to some embodiments, the input of system 600 may be the output of the system 500 illustrated in FIG. 5. In one embodiment, the incoming data is data from one of the feeders, which may be current data from one of the feeders. In another embodiment, the incoming data is from one of the buses, which may be voltage data from one of the buses. In certain embodiments, the calculations performed in system 600 may be performed for each of the feeders and each of the buses in the electric power delivery system.

In order to perform the determination of whether a change in the data has occurred, system 600 may compare the present data ($kxx\_MAG_k$) against data that is a certain number of cycles old. It should be noted that as used herein, in the designation "kxx" the "k" may indicate a measured attribute of the electric power delivery system (such as V for voltage or I for current), and the "xx" may indicate a location on the electric power system associated with the expression, such as "01" for feeder 01. In the illustrated embodiment, the current data is compared to data samples that are six cycles old (i.e., $kxx\_MAG_{k-20}$). Data incoming from FIG. 5 ($kxx\_MAG_k^*$ and $kxx\_ANG_k^*$) may be in polar format. In order to simplify calculations, the incoming data may be converted to rectangular format using filter 602 to produce a real portion $Re_k$ and an imaginary portion $Im_k$. Real and imaginary portions of the data may be stored in a buffer as described below. In alternative embodiments, calculations may be made on polar formats of data, and such filter 602 may not be needed. In such embodiments, polar formats of the incoming data may be stored in the buffer 604.

A first-in-first-out (FIFO) buffer 604 may be used in the comparison of present data with previous data to determine whether a change in the data has occurred. In certain embodiments, the point of comparison on the waveform may depend on the fundamental frequency of the electric power distribution system monitored using system 600. In the currently illustrated embodiment, system 600 may be configured to operate in conjunction with an electric power distribution system operating at a fundamental frequency of 60 Hz. In a 60 Hz system, the period of each cycle is 16.667 ms, and six cycles occur every 100 ms. Further, as discussed above, various embodiments consistent with the present disclosure may sample the electric power distribution system every 5 ms. Accordingly, if system 600 receives data samples every 5 ms, 20 samples are obtained every 100 ms. According to this embodiment, therefore, system 600 includes a FIFO buffer 604 capable of storing 20 samples such that the present sample may be compared with a sample six cycles previous. According to various embodiments, the buffer may store either voltage or current values.

As illustrated summation block 606 may be used to determine a difference between present data (for example, $Re_k$ and $Im_k$) and previous data (for example $Re_{k-20}$ and $Im_{k-20}$). The previous values $Re_{k-20}$ and $Im_{k-20}$ are available from the FIFO buffer 604, and may be summed with present values using Equation 1 to produce difference values $kxx\_D\_Re_k$ and $kxx\_D\_Im_k$:

$$(Re_k - Re_{k-20}) + j(Im_k - Im_{k-20}) \qquad \text{Equation 1}$$

In certain embodiments, the system 600 may include a comparison buffer 612. The comparison buffer 612 may be beneficial to reduce the occurrences of a comparison value being corrupted by fault quantities, and may result in the system resetting itself in the event of a temporary fault such as, for example, a temporary single line to ground fault. In such a system 600, the comparison values ($Co\_Re_k$ and $Co\_Im_k$) are presented to the summation block 606, which sums the comparison values with the present values to produce difference values $kxx\_D\_Re_k$ and $kxx\_D\_Im_k$ according to Equation 2:

$$(Re_k - Co\_Re_k) + j(Im_k - Co\_Im_k) \qquad \text{Equation 2}$$

When no fault was indicated on the previous processing cycle ($kxx\_Te_{k-1}=0$), then switch S1 610 remains in position 1, and the previous values $Re_{k-20}$ and $Im_{k-20}$ from FIFO buffer 604 are fed into the comparison buffer 612 and become the comparison values ($Co\_Re_k$ and $Co\_Im_k$) from the comparison buffer to the summation block 606. Otherwise, if a fault was indicated in the previous processing cycle (for example, $kxx\_Te_{k-1}=1$), then the switch S1 610 is in position 2, wherein the comparison values ($Co\_Re_k$ and $Co\_Im_k$) are fed back into the comparison buffer 612 and remain the comparison values that are presented to the summation block 606. Further discussion of how a fault is indicated follows in conjunction with FIG. 8 which computes $kxx\_TE_k$.

It should be understood system 600 may be on a per-feeder basis where, as previously discussed herein, the "xx" indicator represents the particular feeder. Thus, if a particular feeder exhibits a fault in the previous processing cycle switch S1 610 will be in position 2 for that particular feeder but not for the remaining feeders.

Figure 7:
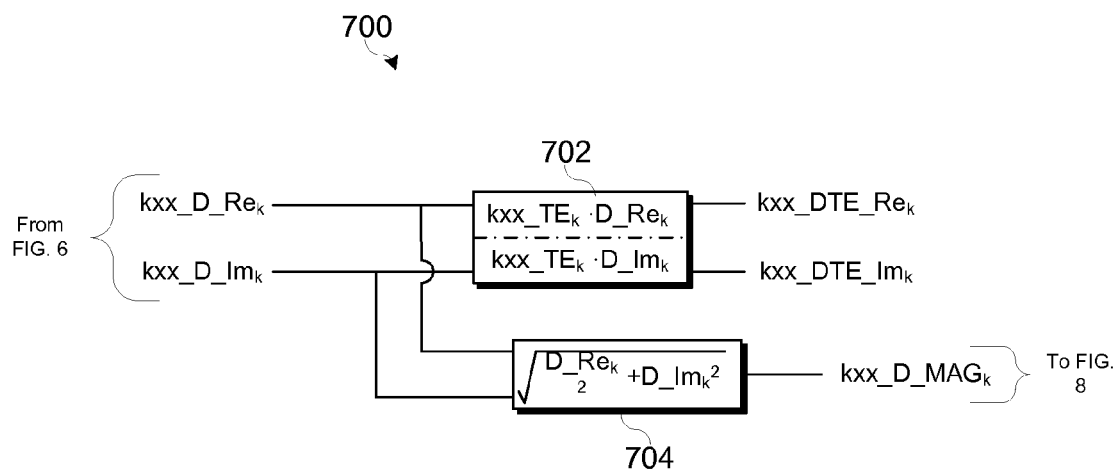
FIG. 7 illustrates a system for identifying elements that experience an incremental change and identifying elements that do not experience an incremental change consistent with embodiments of the present disclosure.

FIG. 7 illustrates a system 700 for identifying elements that experience an incremental change and identifying elements that do not experience an incremental change consistent with various embodiments of the present disclosure. According to some embodiments, system 700 may receive as an input the difference values output of system 600 such as $kxx\_D\_Re_k$ and $kxx\_D\_Im_k$, illustrated in FIG. 6. Using the difference values from system 600, a present difference magnitude value $kxx\_D\_MAGk$ may be computed in 704 by, for example, finding the square root of the sum of the squares of the real and imaginary differences $D\_Re_k$ and $D\_Im_k$. This present difference magnitude $kxx\_D\_MAG_k$ may be used as in input to FIG. 8. The present difference magnitude $kxx\_D\_MAG_k$ may be used in FIG. 8 to determine incremental checks $kxx\_TE_k$ for each difference value.

Figure 8:
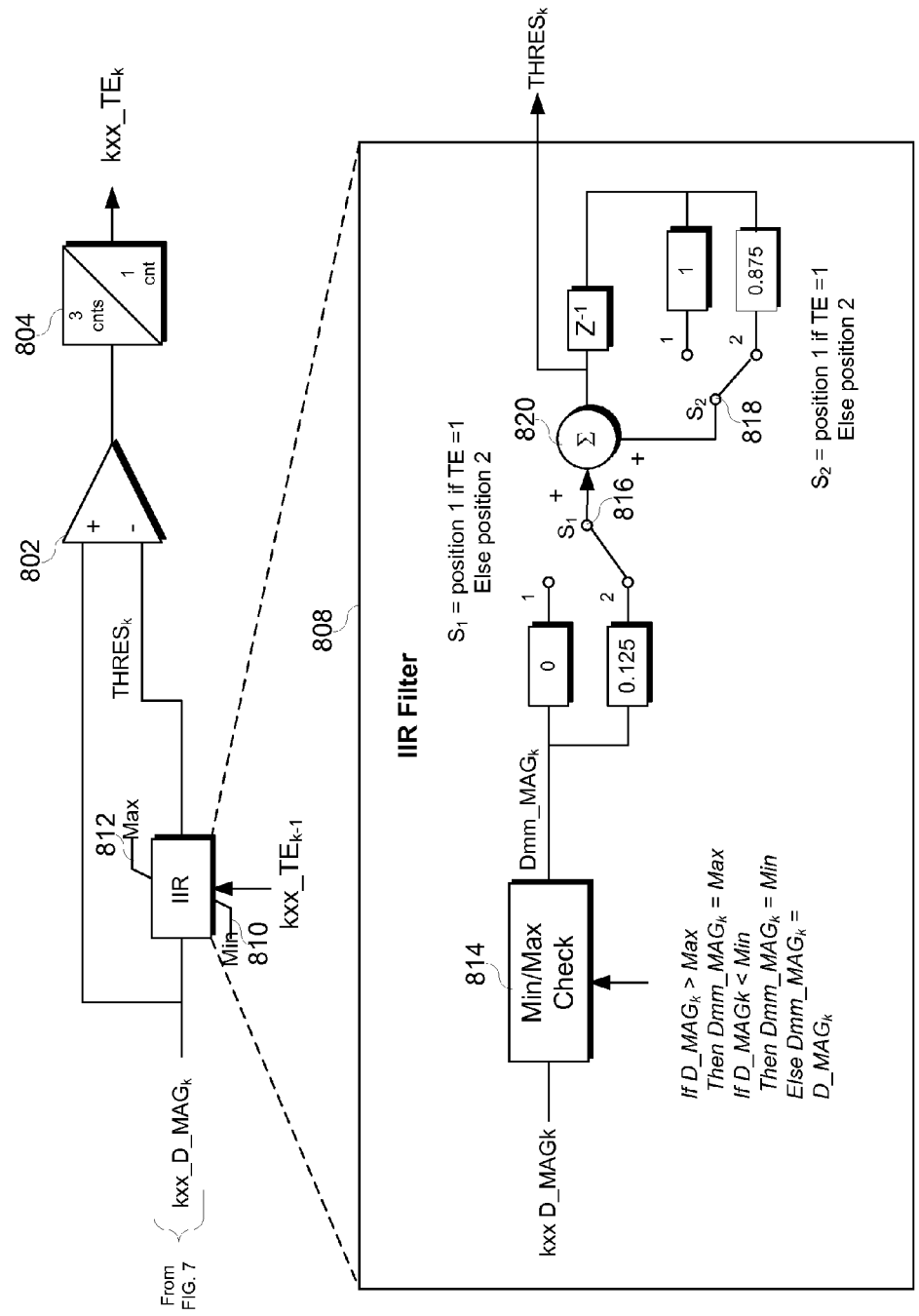
FIG. 8 illustrates a system that compares the present value of the data difference against the average value of the data difference and determines if the data difference is greater than a threshold value for longer than a specified threshold consistent with embodiments of the present disclosure.

Turning again to FIG. 7, using the difference values from system 600, the incremental change of each feeder and of each busbar (for example, $kxx\_DTE\_Re_k$ and $kxx\_DTE\_Im_k$) may be multiplied by the corresponding value of $kxx\_TE_k$ in 702 from FIG. 8. In instances where there has not been an incremental change, the value of $kxx\_TE_k$ is 0, and accordingly, such elements may be set to zero. Elements for which the $kxx\_TE_k$ value is non-zero may result in an output from system 700 that is non-zero. As described above, those elements associated with a fault may exhibit an incremental change. The output of system 700 may, therefore, be used to determine which elements are associated with a faulted zone and those elements that are not associated with a faulted zone.

FIG. 8 illustrates a system 800 that compares in comparator 802 the present value of the data difference ($kxx\_D\_MAG_k$) against the average value of the data difference ($THRES_k$) and determines if the data difference is greater than a threshold value for longer than a specified threshold consistent with certain embodiments of the present disclosure. According to some embodiments, system 800 may receive as an input the present value of the data difference $kxx\_D\_MAG_k$ output of system 700 of FIG. 7. System 800 may compare the value of the data difference $kxx\_D\_MAG_k$ against the average value of the data difference ($THRES_k$) in comparator 802. If the value of the data difference $kxx\_D\_MAG_k$ is greater than the threshold value $THRES_k$ for a predetermined amount of time 804 such as, for example, more than 3 processing intervals/counts (or any other suitable interval) the incremental check logic will assert an output ($kxx\_TE_k$). In other words, the output ($kxx\_TE_k$) indicates that the data has experienced an incremental change. According to some embodiments, the data may be tied to a specific piece of equipment. The data may thus represent, an incremental change in, for example, a feeder's residual current or a busbar's residual voltage.

The threshold ($THRES_k$) may be dynamically calculated using a filter such as an infinite impulse response ("IIR") filter 808 such as that shown in FIG. 8. The threshold value may be generated by comparing the present difference $kxx\_D\_MAG_k$ to a minimum 810 and maximum 812 value in 814. The minimum value 810 and maximum value 812 may be determined as appropriate for each system. If the present difference is less than the minimum value, the minimum value may be used, likewise if the present difference is greater than the maximum value, the maximum value may be used. If the present difference is between the minimum value and the maximum value, the actual present difference value may be used.

Once the present difference value has passed through the minimum/maximum check 814 and the incremental check logic is not asserted ($kxx\_TE_k=0$), the threshold value ($THRES_k$) may be calculated by using $1/8^{th}$ of the new data and $7/8^{th}$ of the previous threshold value ($THRES_{k-1}$), as expressed in Equation 3.

$$THRES_k = \frac{1}{8}Dmm_{MAG_k} + \frac{7}{8}THRES_{k-1} \qquad \text{Equation 3}$$

As illustrated, this may be accomplished by setting both switch S1 816 and switch 2 818 to position 2. It should be understood that other configurations are contemplated. If the incremental check logic element is asserted (i.e., kxx_TEk=1) then the present value of the threshold may be set equal to the previous value of the threshold, as expressed in Equation 4.

$$THRES_k = THRES_{k-1} \qquad \text{Equation 4}$$

As illustrated, this may be accomplished by setting both switch S1 816 and switch 2 181 to position 1. It should be understood that other configurations are contemplated. The maximum value of the IIR filter 808 may be determined according to Equation 5.

```
MAX₀ = 0.015 # 15 mA for current / 15V for voltage _initial    Equation 5
       values
IF D_MAG_{k-3} > MAX_k && TE_k = =0,
    THEN MAX_k = D_MAG_{k-3},
ELSE MAX_k = MAX_{k-1}
```

A torque calculation may be generated for each element having a non-zero output from system 800 of FIG. 8. A reference value for the torque calculation may be generated as the first bus voltage that experiences an incremental change. That is, the voltage where $Vxx\_TE_k=1$, where "V" is voltage and "xx" references the bus. A reference value for the torque calculation for voltage may be generated using Equation 6.

```
IF Vxx_TEk = =1                                    Equation 6
    THEN  VDMAX_RE = Vxx_D_RE,
          VDMAX_IM = Vxx_D_IM,
    ELSE VDMAX_RE = = 0,
         VDMAX_IM = = 0
```

Once the reference voltage has been selected, the incremental torques for current of each feeder may be calculated using Equation 7.

```
IF Ixx_TE_k = =1;                                  Equation 7
    THEN TQR_xx ==((Ixx_DTE_RE_k x
         VDMAX_Im_k) –
         (Ixx_DTE_IM_k x VDMAX_Re_k));
    ELSE TQR_xx==0
```

Once all the torques for each of the feeders have been calculated, the faulted feeder may be determined by identifying the feeder that experienced the greatest positive incremental torque change (TQR_xx). As used herein a "positive" torque change refers to forward flow of current in particular feeder. Similarly, a "negative" torque change refers to backward flow of current in particular feeder. To increase the confidence in the determination of the faulted feeder, certain embodiments may verify that the feeders that experienced the second and third greatest incremental change experienced incremental torque changes in a direction opposite of the faulted feeder (e.g. negative incremental change whereas the faulted feeder experienced a positive incremental change). The process may begin by calculating the absolute torque associated with each feeder using Equation 8.

$$ABS\_TQR\_xx = abs(TQR\_xx) \qquad \text{Equation 8}$$

The sign associated with each incremental change may be determined using Equation 9.

```
IF TQR_xx > 0;                                     Equation 9
    THEN SIGN_TQR_xx = "+";
IF TQR_xx <0;
    THEN SIGN_TQR_xx = "–";
IF TQR_xx==0;
    THEN SIGN_TQR_xx = "non";
```

The results of Equations 8 and 9 may be tabulated using the absolute incremental torque, the sign of the incremental torque, and the feeder associated with each quantity. An example is illustrated in Table 1, below.

TABLE 1

| Row Number | Absolute Incremental Torque | Incremental Torque sign | Feeder Name |
|---|---|---|---|
| 1 | 25 | – | TQR_05 |
| 2 | 45 | + | TQR_08 |
| 3 | 06 | – | TQR_03 |
| 4 | 17 | – | TQR_09 |
| ... | ... | ... | ... |
| n | 0 | + | TQR_xx |

The tabulated results may be sorted using the absolute incremental torque, from maximum to minimum, maintaining the integrity of the row data, as shown below in Table 2.

TABLE 2

| Row Number | Absolute Incremental Torque | Incremental Torque sign | Feeder Name |
|---|---|---|---|
| 1 | 45 | + | TQR_08 |
| 2 | 25 | – | TQR_05 |
| 3 | 17 | – | TQR_09 |
| 4 | 06 | – | TQR_03 |
| ... | ... | ... | ... |
| xx | 0 | + | TQR_xx |

Based on the results shown in Table 2, above, feeder TQR_08 may be identified as the faulted feeder. The identification of feeder TQR_08 may be verified by comparing the incremental torque sign of row 1 to the incremental torque sign of row 2 (i.e., the feeder having the second largest incremental change). If row 2 has a negative incremental torque sign, the confidence in the identification of feeder TQR_08 as the faulted feeder may be increased. Confidence may further be increased in the identification of the faulted feeder if row 3 has a negative incremental torque sign. The verification may be made using Equation 10.

```
IF SIGN_TRQ_(row1)=="+" &&                         Equation 10
    SIGN_TRQ(row2)=="–" &&
        SIGN_TRQ_(row3)=="–";
            FAULT 1 = 1;
ELSE
    FAULT1 = 0;
```

If the incremental torque sign of row 1 and row 3 are negative and row 2 is positive, then an additional verification may be performed to increase the confidence in the identification of the faulted feeder. The verification may be performed by determining whether the absolute incremental torque change of row 2 is greater than a specified threshold. According to one embodiment, the threshold may be 90% of the absolute incremental torque change of row 1. Equation 11 expresses this verification.

```
IF SIGN_TRQ_(row1)=="–" &&                    Equation 11
    SIGN_TRQ(row2)=="+" &&
        SIGN_TRQ_(row3)<>"+";
    {
            IF ABS_TQR_(row2) >
            0.9*ABS_TQR_(row1);
                FAULT2 = 1;
                ELSE FAULT2 = 0;
    }
ELSE FAULT2 = 0;
```

Another possibility is that a simultaneous fault can occur on two feeders. This possibility may be addressed by evaluating Equation 12.

```
IF SIGN_TRQ_(row1)=="+" &&                    Equation 12
    SIGN_TRQ(row2)=="+" &&
        SIGN_TRQ_(row3)<>"–";
    DOUBLE1=1;
    ELSE DOUBLE1 = 0;
```

If FAULT1, FAULT 2 and DOUBLE1, are all equal to zero then a decision of the faulted feeder may not be made.

Figure 9:
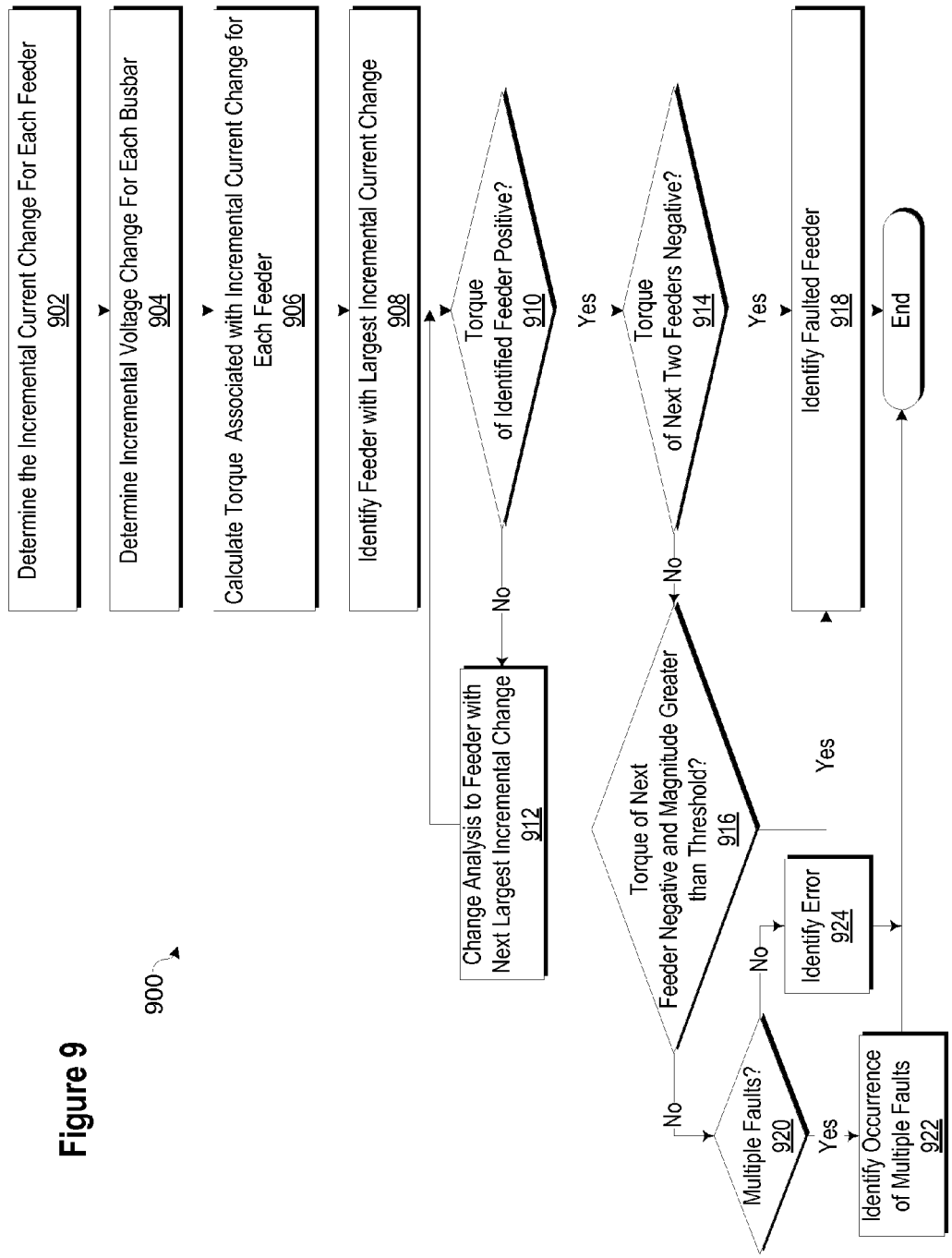
FIG. 9 illustrates a flow chart of one embodiment of a method for detecting a faulted feeder in an electric power distribution system consistent with embodiments of the present disclosure.

FIG. 9 illustrates a flow chart of one embodiment of a method 900 for detecting a faulted feeder in an electric power distribution system consistent with embodiments of the present disclosure. At 902, a system implementing method 900 may determine the incremental current change for each of a plurality of feeders. Similarly, a determination of an incremental voltage change for each busbar may be made, at 904.

As described above, the incremental changes may be associated with a directionality of current flow. At 906, a directionality or torque associated with each feeder having an incremental current change may be calculated. The feeder having the largest incremental current change may be identified at 908. According to some embodiments, the identification of the feeder having the largest incremental current change may involve tabulating the incremental current change associated with each feeder and sorting the tabulated results by the absolute value of the incremental current change.

At 910, it may be determined whether the torque of the identified feeder is positive. As described above, a fault may result in a positive torque, or an increase in the flow of current toward the fault. If the direction of the torque is not positive, at 912, the analysis may be changed to the feeder with the next largest incremental change, and method 900 may return to 910. If the torque of the feeder identified at 910 is positive, at 914, method 900 may determine if the torques of next two feeders, as determined by the largest incremental current change, are negative. As described above, if the next two feeders, as determined by the largest incremental current change, each have a negative torque, confidence in the identification of the faulted feeder is increased. Accordingly, at 918, the faulted feeder may be identified.

If it is determined at 914 that the torques of the next two feeders are not both negative, at 916, it may be determined if the magnitude of the next feeder is negative and greater than a threshold. As noted above, if the torque of the next greatest feeder is negative and the magnitude exceeds a threshold, confidence in the identification of the faulted feeder is increased, and method 900 may move to 918. If the torque of the next feeder is not negative and/or the magnitude does not exceed the threshold, it may be determined whether multiple faults have occurred at 920. If multiple faults have occurred, the occurrence may be identified at 922. If multiple faults have not occurred, an error may be identified at 924.

Figure 10:
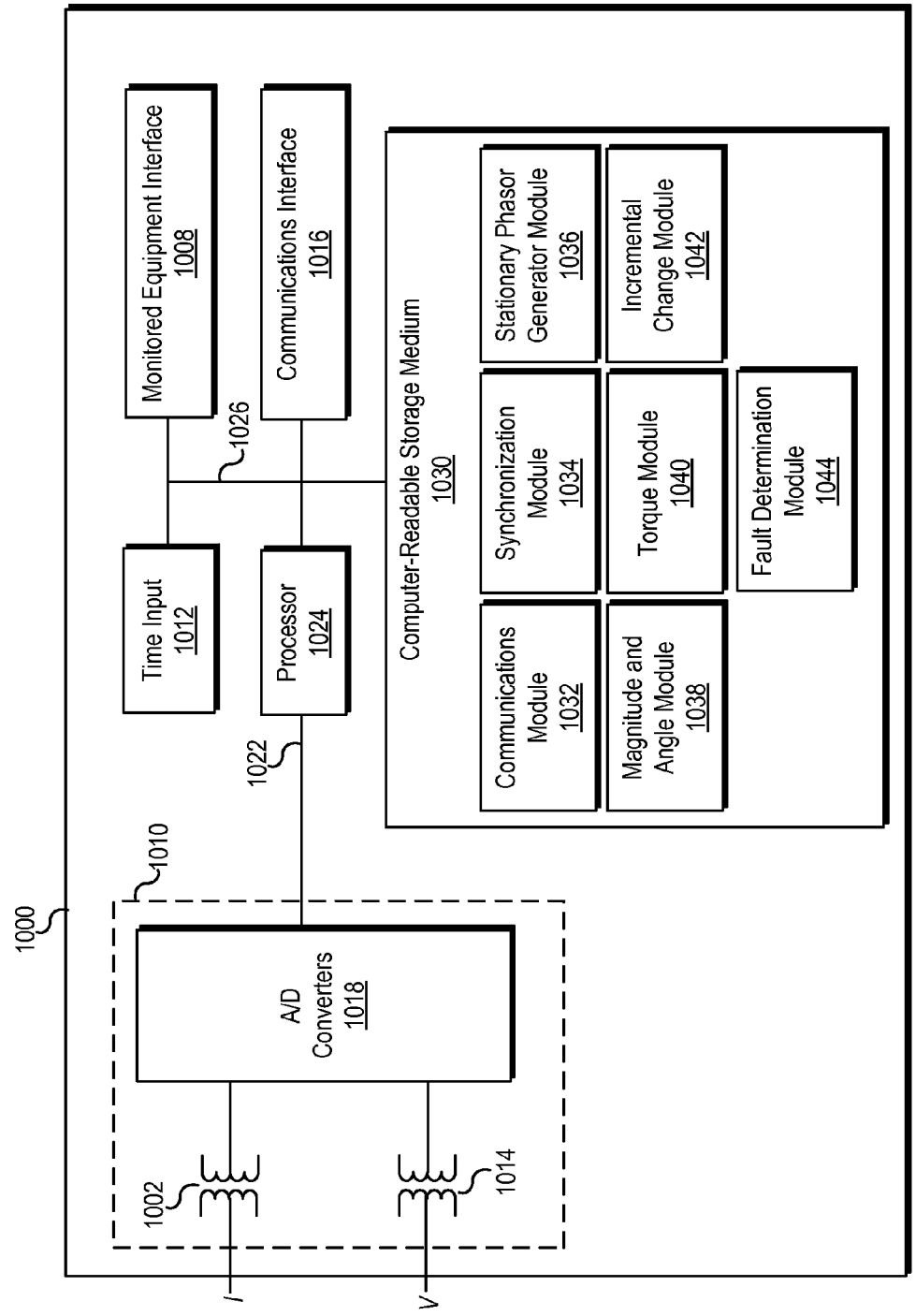
FIG. 10 illustrates a functional block diagram of a system for detecting faults in an ungrounded electrical distribution system consistent with embodiments of the present disclosure.

FIG. 10 illustrates a functional block diagram of a system 1000 for detecting faults in an ungrounded electrical distribution system consistent with embodiments of the present disclosure. In certain embodiments, the system 1000 may comprise an IED system configured to, among other things, determine a faulted feeder in an electric power distribution system. System 1000 may be implemented in an IED using hardware, software, firmware, and/or any combination thereof. Moreover, certain components or functions described herein may be associated with other devices or performed by other devices. The specifically illustrated configuration is merely representative of one embodiment consistent with the present disclosure.

System 1000 includes a communications interface 1016 configured to communicate with other IEDs and/or system devices. In certain embodiments, the communications interface 1016 may facilitate direct communication with another IED or communicate with another IED over a communications network. Communications interface 1016 may facilitate communications with multiple IEDs. System 1000 may further include a time input 1012, which may be used to receive a time signal (e.g., a common time reference) allowing system 1000 to apply a time-stamp to the acquired samples. In certain embodiments, a common time reference may be received via communications interface 1016, and accordingly, a separate time input may not be required for time-stamping and/or synchronization operations. One such embodiment may employ the IEEE 1588 protocol. A monitored equipment interface 1008 may be configured to receive status information from, and issue control instructions to, a piece of monitored equipment (such as a circuit breaker, conductor, transformer, or the like).

Processor 1024 may be configured to process communications received via communications interface 1016, time input 1012, and/or monitored equipment interface 1008. Processor 1024 may operate using any number of processing rates and architectures. Processor 1024 may be configured to perform various algorithms and calculations described herein. Processor 1024 may be embodied as a general purpose integrated circuit, an application specific integrated circuit, a field-programmable gate array, and/or any other suitable programmable logic device.

In certain embodiments, system 1000 may include a sensor component 1010. In the illustrated embodiment, sensor component 1010 is configured to gather data directly from a conductor (not shown) or from secondary outputs from equipment transformers such as, for example, current or voltage transducers (CTs or VTs) and may use, for example, transformers 1002 and 1014 and A/D converters 1018 that may sample and/or digitize filtered waveforms to form corresponding digitized current and voltage signals provided to data bus 1022. A/D converters 1018 may include a single A/D converter or separate A/D converters for each incoming signal. A current signal may include separate current signals from each phase of a three-phase electric power system. A/D converters 1018 may be connected to processor 1024 by way of data bus 1022, through which digitized representations of current and voltage signals may be transmitted to processor 1024. In various embodiments, the digitized current and voltage signals may be used to calculate the location of a fault on a feeder as described herein.

A computer-readable storage medium 1030 may be the repository of various software modules configured to perform any of the methods described herein. A data bus 1026 may link monitored equipment interface 1008, time input 1012, communications interface 1016, and computer-readable storage medium 1030 to processor 1024.

Communications module 1032 may be configured to allow system 1000 to communicate with any of a variety of external devices via communications interface 1016. Communications module 1032 may be configured for communication using a variety of data communication protocols (e.g., Ethernet, IEC 61850, etc.). According to one specific embodiment, communications module 1032 may be configured to facilitate communication in a system such as system 300, which is illustrated in FIG. 3.

Returning to a discussion of FIG. 10, a synchronization module 1034 may be configured to synchronize the operation of system 1000 and/or to time-stamp data received from sensor component 1010 and/or data received via communications interface 1016. Synchronization module 1034 may be configured to generate phasor representations of such measurements, which may be synchronized as synchrophasors in certain embodiments. According to one specific embodiment, synchronization module 1034 may implement the synchronization and timing functions described in connection with system 400, which is illustrated in FIG. 4.

Stationary phasor generator module 1036 may be configured to generate a stationary phasor from a plurality of rotating phasor measurements. In certain embodiments, stationary phasor generator module 1036 may be configured to convert data measurements from "polar" format to the "rectangular" format, in order to facilitate further analysis of the data. According to one specific embodiment, stationary phasor generator module 1036 may implement the conversion functions described in connection with system 500, which is illustrated in FIG. 5.

A magnitude and angle module 1038 may be configured to determine magnitude values associated with various measurements associated with electrical characteristics of an electric power delivery system. Exemplary electrical characteristics may include, for example, voltages, currents, phases, etc. For example, magnitude and angle module 1038 may be configured to determine the magnitude and angle of a plurality of measurements received from sensor component 1010. Magnitude and angle module 1038 may further be configured to identify the largest measurements in a group of measurements.

Torque module 1040 may be configured to determine the torque calculations described herein. For example, torque module 1040 may be configured to implement Equations 5-7, which are described above, and which may be utilized in connection with identifying a faulted feeder in an electric power distribution system.

Incremental change module 1042 may be configured to dynamically determine changes in data values. According to one specific embodiment, incremental change module 1042 may implement the conversion functions described in connection with system 800, which is illustrated in FIG. 8.

A fault determination module 1044 may be configured to implement a method for identifying a faulted feeder using the techniques described herein. Fault determination module 1044 may coordinate its operation with modules 1032-1042 and may utilize information and/or calculations generation by such module. According to one specific embodiment, fault determination module 1044 may implement the method 900, which is illustrated in FIG. 9.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may not include long-distance transmission of high-voltage power. Moreover, principles described herein may also be utilized for protecting an electrical system from over-frequency conditions, wherein power generation would be shed rather than load to reduce effects on the system. Accordingly, many changes may be made to the details of the above-described embodiments without departing from the underlying principles of this disclosure. The scope of the present invention should, therefore, be determined only by the following claims.

What is claimed is:

1. A system for detecting a faulted feeder in an ungrounded electrical power distribution system comprising a plurality of buses and feeders, the system for detecting comprising:
   a plurality of intelligent electronic devices (IEDs) in electrical communication with the buses and feeders to obtain electrical signals therefrom; each IED comprising a communications module and a communications interface for communicating electric power information from the buses and feeders;
   a stationary phasor generator module configured to calculate stationary phasors for voltage information from the buses and current information from the feeders;
   a magnitude and angle module for calculating magnitudes and angles of the voltage information from the buses and current information from the feeders;
   an incremental change module for calculating an incremental change in voltage for each bus, and calculating an incremental change in current for each feeder;
   a torque module for calculating a torque value for each feeder based on the torque value for a first bus with a first incremental change exceeding a threshold and the incremental change in current for each feeder, and determining a relative direction of torque for each feeder; and,
   a fault determination module for identifying a faulted feeder based on the determined torque and relative direction of torque of each feeder.

2. The system of claim 1, wherein the identified faulted feeder comprises the feeder with the greatest incremental change in current.

3. The system of claim 2, wherein the identified faulted feeder comprises the feeder with a relative direction different from feeders with the next two largest incremental changes in current.

4. A method for detecting a faulted feeder in an ungrounded electrical power distribution system comprising a plurality of buses and feeders, the method comprising:
   monitoring an electrical parameter associated with each of the plurality of feeders and buses;
   an Intelligent Electronic Device ("IED") determining an incremental change in the monitored electrical parameters associated with the plurality of feeders and buses;
   the IED identifying a first bus of the plurality of buses having an incremental change exceeding a threshold;
   the IED calculating a reference value using voltage measurements from the identified first bus;
   the IED calculating an incremental change for each feeder of a subset of feeders of the plurality of feeders;
   the IED calculating torque values for the subset of feeders based on the reference value and the incremental changes; and
   identifying the faulted feeder as a feeder with the greatest calculated incremental change.

5. The method of claim 4, wherein identifying the faulted feeder comprises a torque direction opposite a direction of a feeder with the next largest calculated incremental change.

6. The method of claim 5, wherein the feeder with the next largest calculated incremental change is a calculated incremental change greater than a threshold.

7. The method of claim 4 wherein the faulted feeder comprises a torque direction indicating forward power flow.

8. The method of claim 4, wherein the subset of feeders comprises feeders with the same relative torque direction, and the faulted feeder comprises the feeder of the subset of feeders with the greatest calculated incremental change.

9. The method of claim 8, wherein two of the feeders of the subset of feeders with the next two largest calculated incremental changes both have torque directions opposite that of the faulted feeder.

10. The method of claim 8, wherein at least one of two feeders of the subset of feeders with the next two largest calculated incremental changes have the same torque directions as the faulted feeder, and the faulted feeder has a calculated incremental change greater than a threshold.

11. The method of claim 8, wherein at least one of two feeders of the subset of feeders with the next two largest current incremental values comprise torque with torque directions the same as the direction of the torque of the faulted feeder, and the faulted feeder has a calculated incremental change not greater than a threshold, the method further comprising identifying multiple faults.

12. The method of claim 4, wherein at least one of the feeders comprises an underground cable.

13. The method of claim 4, wherein at least one of the feeders comprises an overhead line.

14. The method of claim 4, wherein the incremental change in the monitored electrical parameters associated with the plurality of buses comprises an incremental change in voltage.

15. The method of claim 4, wherein the incremental change in the monitored electrical parameters associated with the plurality of feeders comprises an incremental change in current.

16. An intelligent electronic device (IED) for detecting a faulted feeder in an ungrounded electrical power distribution system that includes a plurality of buses and feeders, the IED comprising:
- a sensor component in electrical communication with the electric power distribution system for obtaining electric power system information from the electric power distribution system;
- a communications interface in communication with another IED for receiving electric power system information therefrom;
- wherein the electric power system information obtained comprises bus voltage information and feeder current information;
- an incremental change module for calculating an incremental change in voltage for each bus, and calculating an incremental change in current for each feeder;
- a torque module for calculating a torque value for each feeder based on the torque value for a first bus with a first incremental change exceeding a threshold and the incremental change in current for each feeder, and determining a relative direction of torque for each feeder; and,
- a fault determination module for identifying a faulted feeder based on the determined torque and relative direction of torque of each feeder.

17. The IED of claim 16, wherein the identified faulted feeder comprises the feeder with the greatest incremental change in current.

18. The IED of claim 17, wherein the identified faulted feeder comprises the feeder with a relative direction different from feeders with the next two largest incremental changes in current.

19. The IED of claim 16, further comprising a stationary phasor generator module configured to calculate stationary phasors for voltage information from the buses and current information from the feeders.

20. The IED of claim 16, further comprising a magnitude and angle module for calculating magnitudes and angles of the voltage information from the buses and current information from the feeders.

* * * * *